(12) United States Patent
Afghahi et al.

(10) Patent No.: US 6,486,913 B1
(45) Date of Patent: Nov. 26, 2002

(54) PIXEL ARRAY WITH SHARED RESET CIRCUITRY

(75) Inventors: Morteza Afghahi, Mission Viejo, CA (US); Ramin Rajabian, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/409,162

(22) Filed: Sep. 30, 1999

(51) Int. Cl.[7] ............................................. H04N 5/335
(52) U.S. Cl. ..................................... 348/308; 348/301
(58) Field of Search ................................. 348/294, 297, 348/300, 301, 302, 308; 257/292; 327/515; 250/208.1; H04N 5/335

(56) References Cited

U.S. PATENT DOCUMENTS

| | | | | |
|---|---|---|---|---|
| 5,970,316 A | * | 10/1999 | Merrill | 438/57 |
| 6,130,423 A | * | 10/2000 | Brehmer et al. | 250/208.1 |
| 6,130,713 A | * | 10/2000 | Merrill | 348/308 |
| 6,160,281 A | * | 12/2000 | Guidash | 257/292 |

FOREIGN PATENT DOCUMENTS

| | | |
|---|---|---|
| DE | 19724392 A1 | 11/1997 |
| EP | 0862219 A | 2/1998 |

* cited by examiner

*Primary Examiner*—Tuan Ho
(74) *Attorney, Agent, or Firm*—Blakely, Sokoloff, Taylor & Zafman LLP

(57) ABSTRACT

An image sensor circuit including a set of pixels associated with a pixel output node and a reset circuit associated with the set of pixels to set each pixel to a predetermined value.

16 Claims, 3 Drawing Sheets

PIXEL ARRAY WITH SHARED RESET CIRCUITRY

BACKGROUND OF THE INVENTION

The invention relates to digital imaging devices and more particularly to pixel layouts or configurations.

DESCRIPTION OF RELATED ART

Image sensing devices are the light detecting component in digital imaging systems, such as for example, digital cameras, scanners and copiers. An image sensing device, such as a camera, uses light to capture an image at a semiconductor-based chip. The chip replaces film in traditional film-based systems. In a camera, an image sensing devices is configured, in its simplest form, to capture a monochrome or a color image by way of semiconductor devices such as transistors, capacitors, and photodiodes. In one example, the image sensing device is a chip made up of a number of pixels, each pixel is sensitive to light.

A pixel contains a photosensitive structure, such as a photodiode, and other pixel circuitry. The photosensitive structure is the portion of the pixel that respond to light. In a typical operation, a pixel circuit having a photodiode is charged to a predetermined voltage, the photodiode is exposed to light, and the pixel circuit discharges its stored energy depending on the intensity of the light exposure. A three-transistor pixel circuit for example, consists of a reset transistor, a row transistor, a source follower transistor, and a photodiode. A shift register or decoder external to the pixel circuit generates a signal that inverts the reset transistor and the row transistor (through a bit line) to drive the circuit and read out a predetermined value (e.g., $V_{cc}$) and the light signal. The difference between the predetermined voltage and the light signal is a measure of the intensity of the light striking the photodiode.

Pixel circuits may be arranged in pixel arrays, such as, for example, several rows and columns of pixel circuits. The individual pixel circuits may be coupled through word and bit lines. The reset signal generated by the shift register or decoder may be global (i.e., entire array) or may be limited to a single pixel or row of pixels. The bit line signals a row to discharge its signal along the word line to a collector such as an analog-to-digital (A/D) converter.

Pixel circuits, such as the three-transistor pixel circuit described above are formed, in one embodiment, in and on a semiconductor-based chip. One goal in forming a pixel circuit or an array of pixel circuits is to maximize the photosensitive area of the circuit and minimize the amount of area required for the additional pixel circuitry.

The trend in digital imaging is towards higher and higher image resolution. One way this is achieved is by reducing the size of pixel circuits. The trend is particularly pushed by charge coupled device (CCD) manufacturers, as one of the main advantages of a CCD manufacturer is a small pixel circuit. One way that CMOS-based image sensors may stay competitive with their CCD-based counterparts is by reducing the pixel size to a size similar to a CCD pixel with comparative sensitivity.

SUMMARY OF THE INVENTION

An image sensor circuit is disclosed. In one aspect, the image sensor circuit includes a set of pixels associated with a pixel output node and a reset circuit associated with the set of pixels to set each pixel to a predetermined value.

BRIEF DESCRIPTION OF THE DRAWINGS

The features, aspects, and advantages of the invention will become more thoroughly apparent from the following detailed description, appended claims, and accompanying drawings in which:

DETAILED DESCRIPTION OF THE INVENTION

The invention relates to a pixel array, an image sensor circuit, and an imaging system. In one aspect, the pixel array includes at least a pair of pixel circuits that share a reset electrode to establish a predetermined signal at each of the adjacent pixels. The adjacent pixels are, for example, part of a pixel array of a plurality of rows and columns such as contemplated in a digital camera. The reset electrode, in one embodiment, is disposed around the photosensitive region of each pixel. The configuration of the electrode around the photosensitive area separates the photosensitive area from isolation structures (such as shallow trench isolation). The interaction between photosensitive structures and isolation structures led to unwanted leakage current in prior art structures. By sharing a reset electrode, the pixel area of adjacent pixels and the pixel array in general may be reduced.

In various embodiments of an imaging system, the imaging system comprises an optical system to be exposed to light and an imaging sensor coupled to the optical system in order to receive the light, wherein the image sensor has a plurality of pixels. The pixels each comprise photodetecting circuitry to provide a signal representative of the light, shared resetting circuitry to provide a predetermined signal to the pixels, amplifying circuitry to provide an output signal in response to receiving the signal representative of the light at an input, storage circuitry coupled to an output to provide an exposed voltage in response to the output signal, image processing circuitry coupled to the storage circuitry to provide captured image data, and an output interface to provide captured image data to an image processing system.

Figure 1:
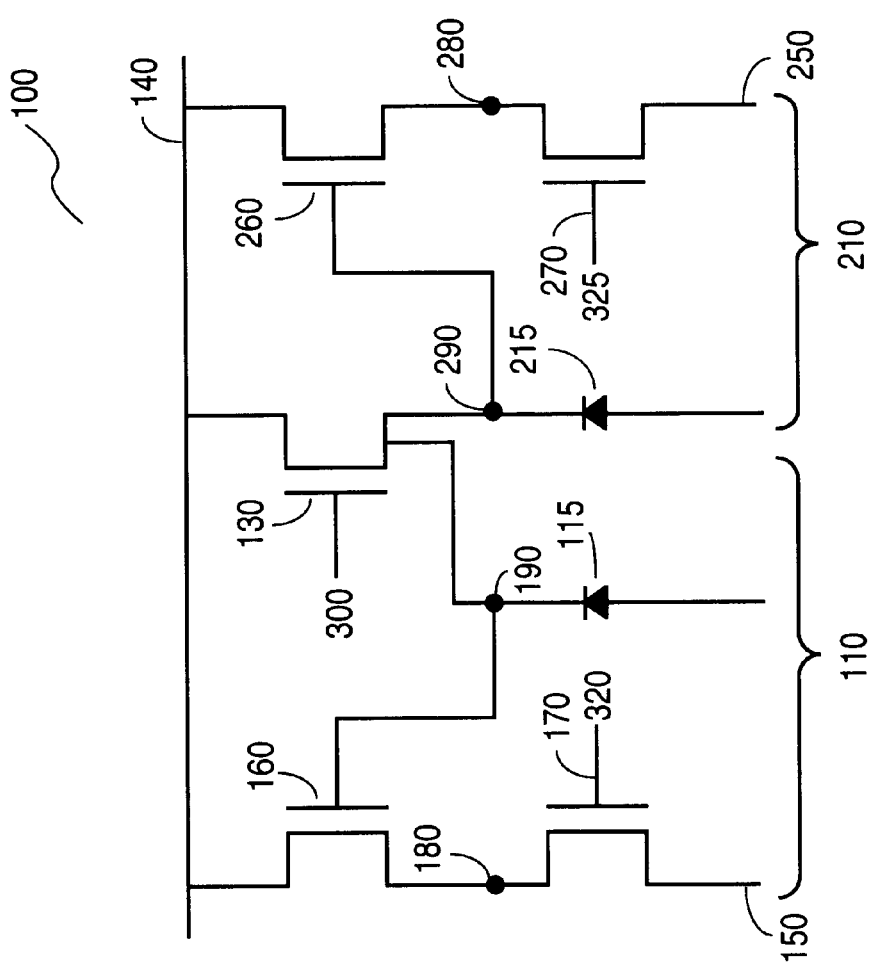
FIG. 1 shows a circuit layout of two adjacent pixel circuits according to an embodiment of the invention.

FIG. 1 illustrates a circuit layout of two adjacent pixel circuits according to the invention. In this embodiment, each pixel circuit is a three-transistor pixel circuit having a row transistor, a source follower transistor, and sharing a reset transistor electrode of a reset transistor. Adjacent pixel circuits 100 are described, in this embodiment, in terms of pixel cell 110 and pixel cell 210. The operation of each circuit is the same.

Cell 110 and cell 210 operate in response to a reset signal used to turn on reset transistor electrode 130. Reset transistor electrode 130 is turned on at a decoder or shift register external to cell 110 and cell 210. A reset signal may be global (e.g., resetting an entire array) or may reset one or more rows. Reset signal 300 turns on reset transistor electrode 130 to take diode node 190 and diode node 290, respectively, to a predetermined voltage value, such as $V_{cc}$ 140. The value at diode node 190 and diode node 290 is read out to an external collector at bit line 150 and bit line 250, respectively. Source follower transistor 160 and source follower transistor 260, respectively, amplify the voltage value. A first Row signal 320 and 325 from the decoder or shift register turns on row transistor 170 and row transistor 270, respectively, and the amplified signal at node 180 and node 280, respectively, is collected over bit line 150 and bit line 250, respectively.

When the desired object or scene comes into view of the image sensor containing cell 110 and cell 210, an exposure timer (not shown) is triggered and reset transistor 130 is turned off. Thereafter, photo-generated electron/hole pairs generated in photodiode 115 or photodiode 215 caused by a photocurrent (light-generated signal) are allowed to decay. After a predetermined time, a second row signal 320 and 325 from the decoder or shift register turns on transistor 170 or transistor 270 and a voltage at node 180 and node 280 is transmitted over bit line 150 and bit line 250, respectively. The difference between the first value read at the bit line and the second value read at the bit line is proportional to the amount of light sensed by photodiode 115 and photodiode 215, respectively.

In the embodiment described, cell 110 and cell 210 share a common reset transistor electrode. In this manner, an individual reset transistor is unnecessary for each of cell 110 and cell 210. Thus, a space saving (e.g., area saving) may be realized between adjacent pixels. The spacing saving allows the individual cells to occupy a smaller area than their prior art counterparts.

Figure 2:
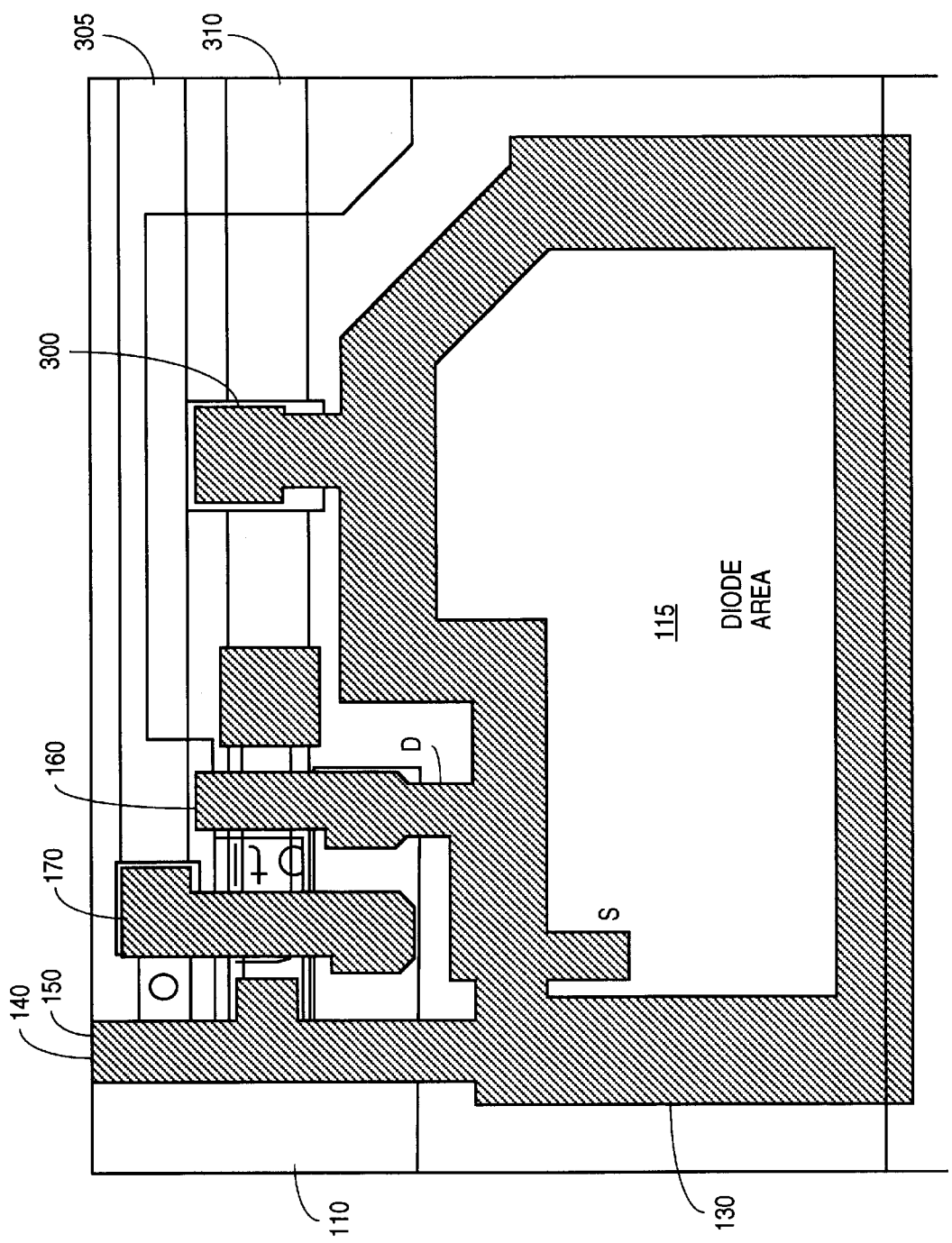
FIG. 2 shows an exemplary layout of one cell of the adjacent pixel circuits of FIG. 1.

FIG. 2 shows a top view of a fabrication layout of cell 110. The process for forming such a structure may generally be described as follows. First, cell 110 is patterned to define transistor regions and photosensing regions. As shown in FIG. 2, in this embodiment, cell 110 contains three transistors. Next, a polycrystalline silicon (polysilicon) layer is deposited and patterned to form the individual gate electrodes of the three-transistors. It is to be appreciated that other electrode materials, such as metal gate electrodes are also suitable. As shown in FIG. 2, the electrode of reset transistor electrode 130 includes an electrode surrounding photosensing structure 115. Similarly, the electrode of row transistor 170 and source follower transistor 160 are patterned.

Once the individual electrodes of the three transistor circuits are patterned, an implant to provide junction (e.g., source and drain) regions for the transistors and photosensing structure 115 is accomplished.

As will be demonstrated, patterning reset electrode 130 around photosensing structure 115 allows the electrode to be shared by adjacent pixels. In addition, such a configuration should reduce leakage current associated with the photosensing structure 115 in prior art structures. In prior art structures, a photosensing structure such as a photodiode, is surrounded by isolation structures, such as shallow trench isolation (STI). Leakage current at the interface between a photodiode and STI has been identified on the order of 20 nanoamps per square centimeter. By surrounding photosensing structure 115 with reset electrode 130, (such as STI) is separated from photosensing structure 115, the leakage current attributed to the isolation structure/photosensing interface is eliminated. Still further, in conventional operation, the voltage to reset electrode 130 is off when photosensing. Thus, photosensing structure 130 is further isolated from potential leakage current.

Once the transistors and photosensing structures are formed, in one embodiment, conventional patterning steps are utilized to form the pixel circuit, e.g., contacts to gate electrodes and junctions, bit line 150 and $V_{cc}$ 140, row signal line 305 and reset signal line 310. It is to be appreciated that one or more of these lines may overlap (e.g., in different device layers) and therefore are not explicitly shown in FIG. 2.

Figure 3:
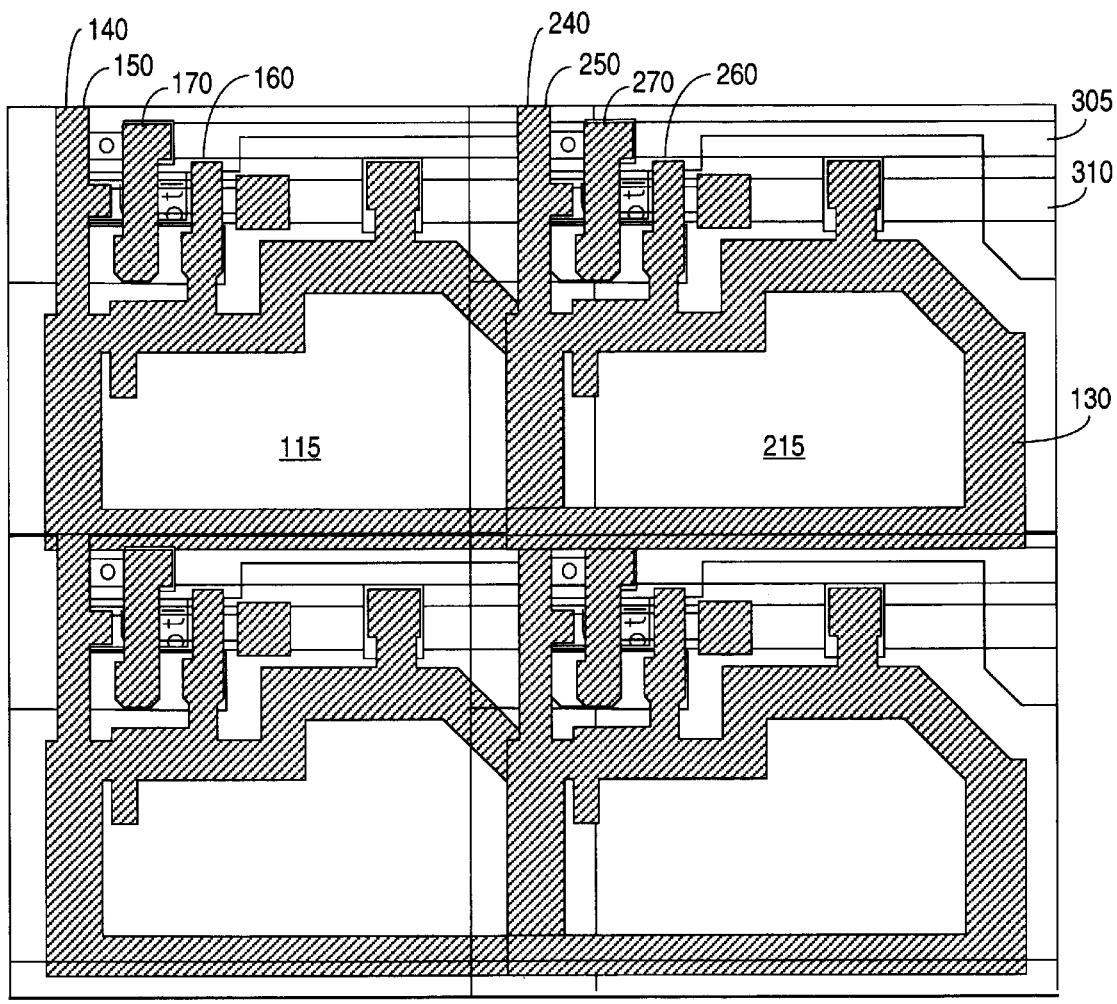
FIG. 3 shows a top view of the fabrication layout of two adjacent rows and two adjacent columns of pixel circuits.

FIG. 3 shows the fabrication layout of two adjacent rows and two adjacent columns. Reference numerals for cell 110 and cell 210 are provided. As can be seen in FIG. 3, reset transistor electrode 130 of adjacent cells 110 and 210 (adjacent row cells) is shared between the adjacent cells. The same principle can be used to share the reset transistor between two adjacent columns, or between adjacent rows and columns. The sharing of the transistor provides a space (e.g., area) savings that permits more pixels in a given space. With this configuration, the ratio of pixel size to sensitive area ("fill factor") can be increased.

Reduced pixel size also means that dies may be made smaller and faster. In one aspect, the principles of the invention generally teach the sharing of a transistor gate electrode configured about a photosensing structure. These principles may be extended to couple all the electrodes of a circuit or circuits together, i.e., eliminate metal interconnection lines. Such an extension finds use, for example, in DRAM applications. For example, connecting access transistors in a row should limit the leakage current of the cell.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. An image sensor circuit comprising:
    a set of pixels associated with a pixel output node; and
    a reset circuit associated with the set of pixels to set each pixel to a predetermined value, the reset circuit comprising an electrode that surrounds at least a portion of the set of pixels.

2. The image sensor of claim 1, wherein the reset circuit comprises a transistor and wherein a gate of the transistor is associated with the set of pixels.

3. The image sensor of claim 2, wherein the set of pixels comprises a pair of adjacent pixels.

4. The image sensor of claim 3, wherein the pair of adjacent pixels comprise one of a row array and a column array.

5. The image sensor of claim 2, wherein each of the set of pixels comprises a photosensitive region the gate of the reset transistor comprises a first gate that surrounds the first photosensitive region, the image sensor further comprising a second gate electrode coupled to the first gate electrode and surrounding a second photosensitive region.

6. A pixel array comprising:
    a first pixel comprising a first light sensitive circuit element;
    a second pixel comprising a second light sensitive circuit element;
    a reset electrode to establish a predetermined signal at the first pixel and the second pixel;
    a first differential circuit coupled to the first light sensitive circuit element to measure a value corresponding to a difference of the predetermined signal and a signal generated by the first light sensitive circuit element; and
    a second differential circuit coupled to the second light sensitive circuit element to measure a value corresponding to a difference of the predetermined signal and a signal generated by the second light sensitive circuit element.

7. The pixel array of claim 6, wherein the reset electrode comprises a first transistor gate electrode surrounding the first light sensitive circuit and a second transistor gate electrode coupled to the first gate electrode and surrounding the second light sensitive circuit.

8. The pixel array of claim 7, wherein the first differential circuit comprises a first transistor including a gate electrode coupled to a register and the second differential circuit comprises a second transistor including a gate electrode coupled to the register and the register generates a signal to each gate electrode.

9. The pixel array of claim 8, further comprising a first source follower transistor coupled to the first light sensitive circuit element to receive the signal generated by the first light sensitive element and a second source follower transistor coupled to the second light sensitive circuit element to receive the signal generated by the second light sensitive circuit element.

10. The pixel array of claim 6, wherein the first pixel and the second pixel are adjacent one another.

11. An imaging system comprising:

an optical system for being exposed to a light;

an image sensor coupled to the optical system to receive the light, the image sensor having a plurality of pixels, a pixel comprising:
photodetecting circuitry providing a signal representative of the light,
shared resetting circuitry providing a predetermined signal to the pixels, the resetting circuitry comprising a transistor having a gate surrounding a photodetecting structure of the photodetecting circuitry,
amplifying circuitry, providing an output signal in response to receiving the signal representative of the light at an input,
storage circuitry coupled to the output providing an exposed voltage in response to output signal;

image processing circuitry coupled to the storage circuitry providing captured image data; and an output interface providing captured image data to an image processing system.

12. The imaging system of claim 11, wherein the shared resetting circuitry comprises a signal to a gate f a first transistor of a first pixel and a gate of a second transistor of a second pixel.

13. The imaging system of claim 12, wherein the gate of the first transistor surrounds a photodetecting structure of the photodetecting circuitry of a first pixel and the gate of the second transistor surrounds a photodetecting structure of the photodetecting circuitry of a second pixel.

14. The imaging system of claim 13, wherein the first pixel and the second pixel are adjacent pixels and are in one of a row array and a column array.

15. A pixel circuit comprising:

a light sensitive element coupled to a node;

a reset transistor coupled to the node to establish a signal at the node, the reset transistor comprising an electrode that surrounds the light sensitive element.

16. The pixel circuit of claim 15, wherein the light sensitive element comprises a region in a substrate and the electrode is formed adjacent the region.

* * * * *